(12) United States Patent
Tu (10) Patent No.: US 9,741,824 B2
(45) Date of Patent: Aug. 22, 2017

(54) SEMICONDUCTOR DEVICE AND FABRICATION METHOD THEREOF

(71) Applicant: Semiconductor Manufacturing International (Shanghai) Corporation, Shanghai (CN)

(72) Inventor: Huojin Tu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 63 days.

(21) Appl. No.: 14/828,569

(22) Filed: Aug. 18, 2015

(65) Prior Publication Data

US 2016/0064522 A1 Mar. 3, 2016

(30) Foreign Application Priority Data

Sep. 1, 2014 (CN) .......................... 2014 1 0440271

(51) Int. Cl.
| | |
|---|---|
| *H01L 29/66* | (2006.01) |
| *H01L 29/16* | (2006.01) |
| *H01L 29/78* | (2006.01) |
| *H01L 29/165* | (2006.01) |
| *H01L 29/417* | (2006.01) |
| *H01L 29/08* | (2006.01) |

(52) U.S. Cl.
CPC .... *H01L 29/66636* (2013.01); *H01L 29/0847* (2013.01); *H01L 29/165* (2013.01); *H01L 29/41783* (2013.01); *H01L 29/66628* (2013.01); *H01L 29/7848* (2013.01)

(58) Field of Classification Search
CPC ......... H01L 29/41783; H01L 29/66628; H01L 29/165; H01L 29/66636; H01L 29/7848; H01L 29/0847
USPC .......................................... 257/192; 438/285
See application file for complete search history.

(56) References Cited

U.S. PATENT DOCUMENTS

| | | | | |
|---|---|---|---|---|
| 2005/0079692 | A1* | 4/2005 | Samoilov | ............ H01L 21/0245 438/481 |
| 2009/0020820 | A1* | 1/2009 | Baik | ............... H01L 21/823807 257/369 |
| 2010/0301350 | A1* | 12/2010 | Tamura | ........... H01L 21/823807 257/77 |
| 2013/0320434 | A1* | 12/2013 | Shin | .................... H01L 29/7827 257/329 |
| 2014/0070377 | A1* | 3/2014 | Yu | ......................... C30B 25/165 257/655 |

* cited by examiner

*Primary Examiner* — Cuong Q Nguyen
*Assistant Examiner* — Tong-Ho Kim
(74) *Attorney, Agent, or Firm* — Anova Law Group, PLLC (57) ABSTRACT

The present disclosure provides a method for forming a semiconductor device. The method includes providing a semiconductor substrate; forming a gate structure on the semiconductor substrate; and forming trenches in the semiconductor substrate on both sides of the gate structure. The method also includes forming a stress layer on inner sidewalls of each trench to fill up the trench; forming an interlayer on the stress layer, and forming a capping layer on the interlayer, wherein a top surface of the capping layer is higher than a top surface of the semiconductor substrate, and a lattice mismatch between the interlayer and the capping layer is lower than a lattice mismatch between the capping layer and the stress layer.

20 Claims, 5 Drawing Sheets

SEMICONDUCTOR DEVICE AND FABRICATION METHOD THEREOF

CROSS-REFERENCES TO RELATED APPLICATIONS

This application claims the priority of Chinese Patent Application No. 201410440271.9, filed on Sep. 1, 2014, the entire content of which is incorporated herein by reference.

FIELD OF THE DISCLOSURE

The present disclosure relates to the field of semiconductor technology, more particularly, relates to a semiconductor device and fabrication method thereof.

BACKGROUND

Advances in semiconductor technology have enabled the dimensions of semiconductor devices to be continuously reduced. As a result, the properties and performances of transistors are affected by the dimension shrinkage. To further improve the properties and performances of transistors, strain engineering has been introduced to the manufacturing of transistors. By applying compressive stress on a channel region of a transistor, hole mobility in the channel region may be improved. By applying tensile stress on the channel region of a semiconductor, electron mobility in the channel region may be improved.

Since electrons have higher mobility than holes in single-crystal silicon, in conventional semiconductor manufacturing, strain engineering is often used to improve hole mobility in PMOS transistors. The carrier mobility in PMOS transistors can thus be comparable to the carrier mobility in NMOS transistors. Strained materials are often used to form the source and drain regions of a PMOS transistor such that compressive stress may be applied on the channel region of the PMOS transistor to improve the hole mobility in the channel region. Specifically, the process to form the source and drain regions using strained materials includes the following process. First, trenches are formed in the substrate on both sides of the gate structure of the PMOS transistor. Further, the trenches are filled with a strained material. The trenches may function as the source region of the PMOS transistor. The lattice constant of the strained material is often greater than the lattice constant of the material in the channel region. Thus, the strained material can apply compressive stress on channel region of the PMOS transistor. SiGe has been commonly used as the strained material for the PMOS transistor. In conventional semiconductor manufacturing, SiC is often used as the strained material for the source and the drain regions of an NMOS transistor to further improve the carrier mobility of the NMOS transistor.

However, source and drain regions formed using conventional semiconductor manufacturing processes may be highly defective on the surfaces of the source and the drain regions. As a result, contact resistance of a source region or a drain region may be undesirably high. Thus, properties and performances of the transistors formed through conventional semiconductor manufacturing may be adversely affected.

BRIEF SUMMARY OF THE DISCLOSURE

The present disclosure is set forth to solve the problem of, for example, reducing defects in the stress layer and improving the quality of capping layer, and other problems.

One aspect of the present disclosure provides a method for forming a semiconductor device. The method includes providing a semiconductor substrate; forming a gate structure on the semiconductor substrate; and forming trenches in the semiconductor substrate on both sides of the gate structure. The method also includes forming a stress layer on inner sidewalls of each trench to fill up the trench; forming an interlayer on the stress layer, and forming a capping layer on the interlayer, wherein a top surface of the capping layer is higher than a top surface of the semiconductor substrate, and a lattice mismatch between the interlayer and the capping layer is lower than a lattice mismatch between the capping layer and the stress layer.

Another aspect of the present disclosure provides a semiconductor device. The semiconductor device includes a semiconductor substrate; a gate structure on the semiconductor substrate; and trenches in the semiconductor substrate on both sides of the gate structure. The semiconductor device also includes a stress layer on inner sidewalls of each trench to fill up the trench; an interlayer on the stress layer; and a capping layer on the interlayer, wherein a top surface of the capping layer is higher than a top surface of the semiconductor substrate, and a lattice mismatch between the capping layer and the interlayer is lower than a lattice match between the capping layer and the stress layer.

Other aspects or embodiments of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

In the process of forming the source and drain regions of a transistor using strain engineering, a stress layer is often formed. The formation of a stress layer often includes the formations of a seed layer, a body layer on the seed layer, and a capping layer on the body layer. The stress layer may be made of SiGe or SiC. The Ge or C content in the capping layer may be much lower than the Ge or C content in the body layer such that the lattice constant of the capping layer material is significantly different from the lattice constant of the body layer. Because the epitaxial growth rate of SiC or SiGe is sufficiently high, high stress might be formed as a result of the lattice mismatch between the capping layer and the body layer. However, a large amount of defects may be formed in the capping layer, and the properties and performance of the transistor may be adversely affected.

In one embodiment, after the body layer is formed, an interlayer may be formed on the body layer. A capping layer may be further formed on the interlayer. The epitaxial growth rate of the interlayer is lower than the epitaxial growth rate of the capping layer so that the formed interlayer may have no or little defects. Further, since the lattice mismatch between the interlayer and the capping layer may be sufficiently small, the quality of the formed capping layer may be improved. Properties and performance of the transistor formed through the disclosed method may be improved.

Figure 6:
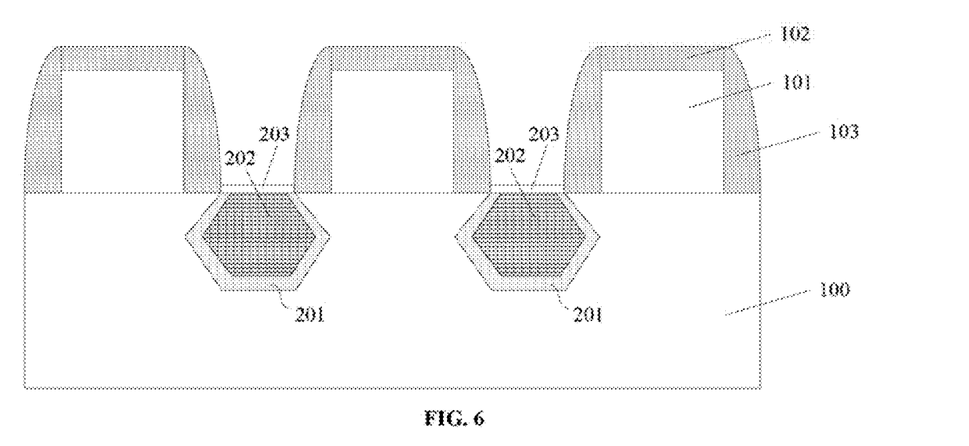
Figure 7:
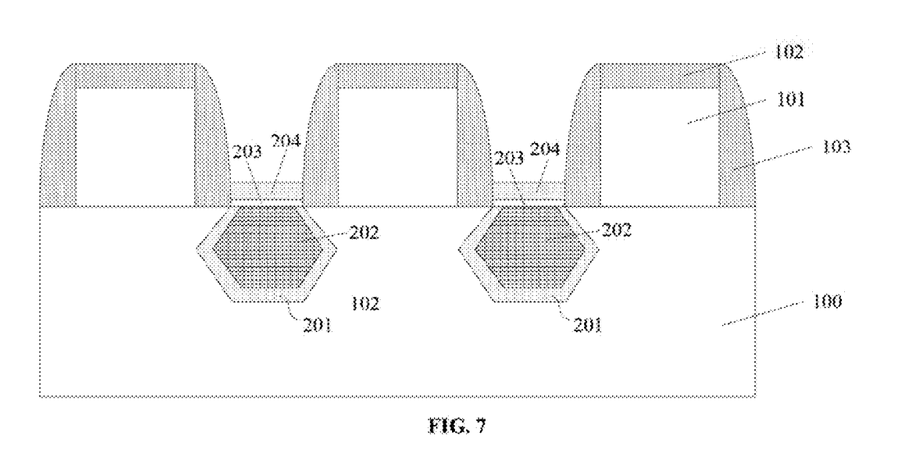
Figure 8:
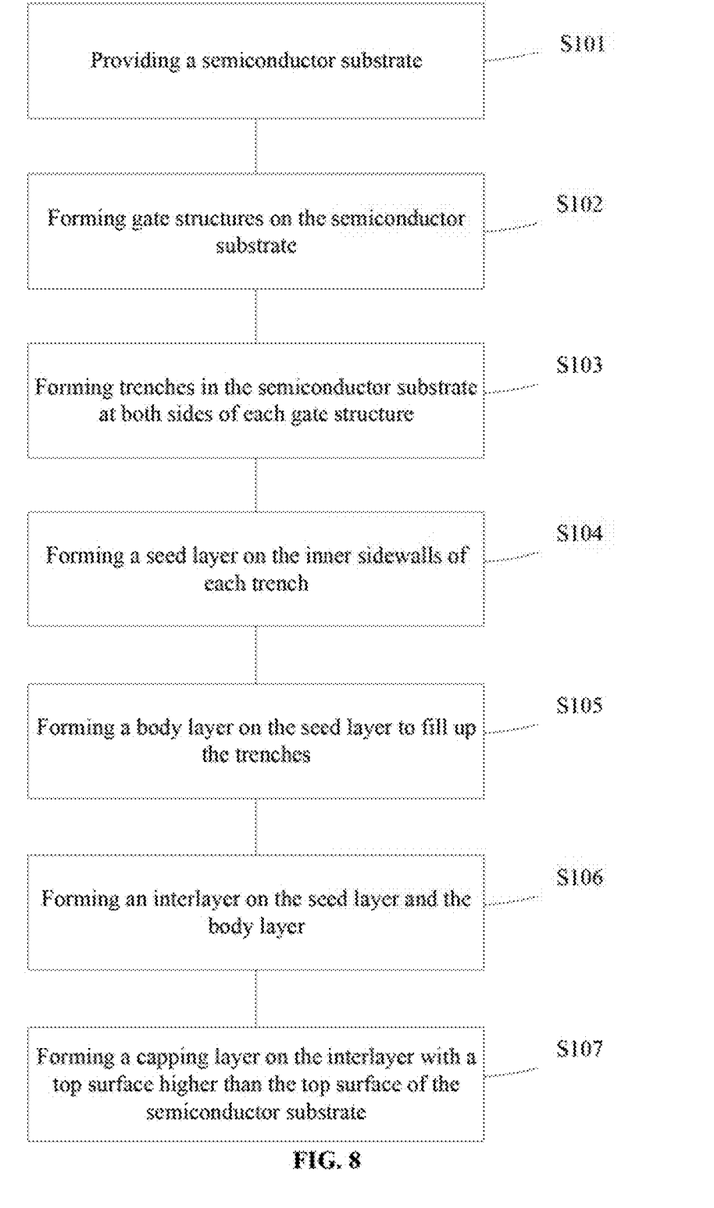
FIG. 8 illustrates an exemplary fabrication process of a transistor consistent with the disclosed embodiments.

FIG. 8 illustrates an exemplary fabrication process of transistors and FIGS. 1 to 7 illustrate exemplary transistor structures corresponding to various stages of the exemplary fabrication process.

Figure 1:
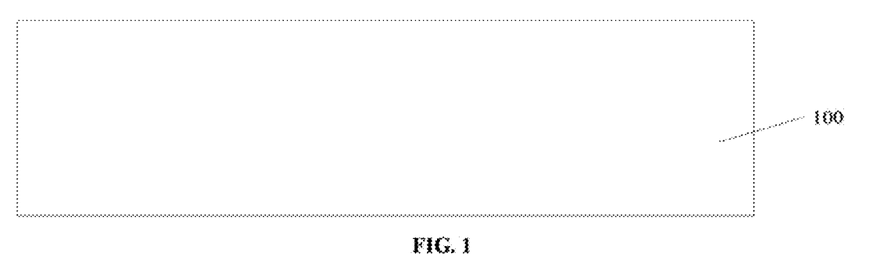
FIGS. 1 to 7 illustrate the structure of a transistor corresponding to certain stages of an exemplary fabrication process consistent with the disclosed embodiments.

As shown in FIG. 8, at the beginning of the fabrication process, a semiconductor substrate is provided (S101). FIG. 1 illustrates a corresponding semiconductor structure.

As shown in FIG. 1, a semiconductor substrate 100 may be provided. The semiconductor substrate 100 may be made of one of the semiconductor materials such as Si, Ge, SiGe, and/or GaAs. The semiconductor substrate 100 may also be made of a composite semiconductor material such as SOI (silicon on insulator). The material of the semiconductor substrate 100 may be chosen based on the specific type of the semiconductor device to be formed by those skilled in the art and should not be limited by the embodiments of the present disclosure. In one embodiment, the semiconductor substrate 100 may be made of single-crystal silicon.

In one embodiment, the transistors to be formed may be planar transistors, and gate structures of the transistors may be formed directly on the semiconductor substrate 100. In certain other embodiments, the transistors to be formed may be fin transistors (FinFETs). That is, the semiconductor substrate 100 may further include fins. Gate structures may be formed over fin structures on the semiconductor substrate 100, and source and drain regions may be formed in fins on both sides of a gate structure.

Figure 2:
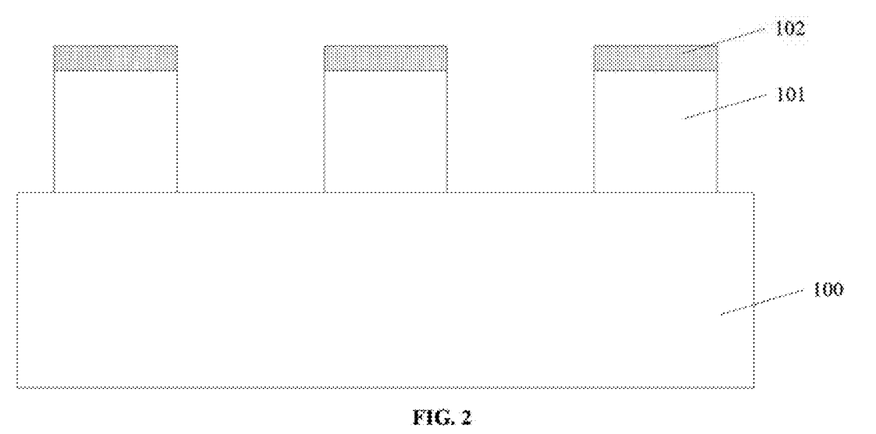

Returning to FIG. 8, after the semiconductor substrate is provided, gate structures are formed on the semiconductor substrate (S102). FIG. 2 illustrates a corresponding semiconductor structure.

As shown in FIG. 2, gate structures 101 may be formed on the semiconductor substrate 100. A gate structure 101 may include a gate dielectric layer on the semiconductor substrate 100 and a gate electrode layer on the gate dielectric layer. The gate dielectric layer may be made of $SiO_2$, and the gate electrode layer may be made of poly-silicon. In other various embodiments of the present disclosure, the gate dielectric layer may be made of a high-k dielectric material, and the gate electrode layer may be made of metal.

To form a gate structure 101, a gate dielectric material layer (not shown) may be formed on the semiconductor substrate 100, and a gate electrode material layer (not shown) may be formed subsequently on the gate dielectric layer. A patterned mask layer 102 may be formed on the gate electrode material layer to define the location and size of each subsequently-formed gate structure. The patterned mask layer 102 may be used as the etch mask for etching the gate dielectric material layer and the gate electrode material layer. The patterned mask layer 102 may provide protection for the gate structure 101 in subsequent fabrication steps. Thus, the gate structures 101 may be formed.

Embodiments are exemplified by the formation process of three separate gate structures 101. Source and drain regions may be further formed in the semiconductor substrate 100 between adjacent gate structures. The transistors corresponding to two adjacent gate structures 101 may share a source region or a drain region.

In other various embodiments of the present disclosure, other quantities of gate structures 101 may be formed on the semiconductor substrate 100.

In other various embodiments of the present disclosure, the transistors to be formed may be FinFETs. The gate structure of a FinFET may be formed over a fin structure on the semiconductor substrate 100. The fin structure may include a plurality of separate fins. FIG. 2 may be a cross-section view of the FinFETs along length of a fin. A source or drain region may be formed in the fin between two adjacent gate structures 101.

In other various embodiments of the present disclosure, the semiconductor substrate 100 may further include STI (shallow trench isolation) structures. The source region or drain regions of two adjacent transistors may be isolated by an STI structure.

Figure 3:
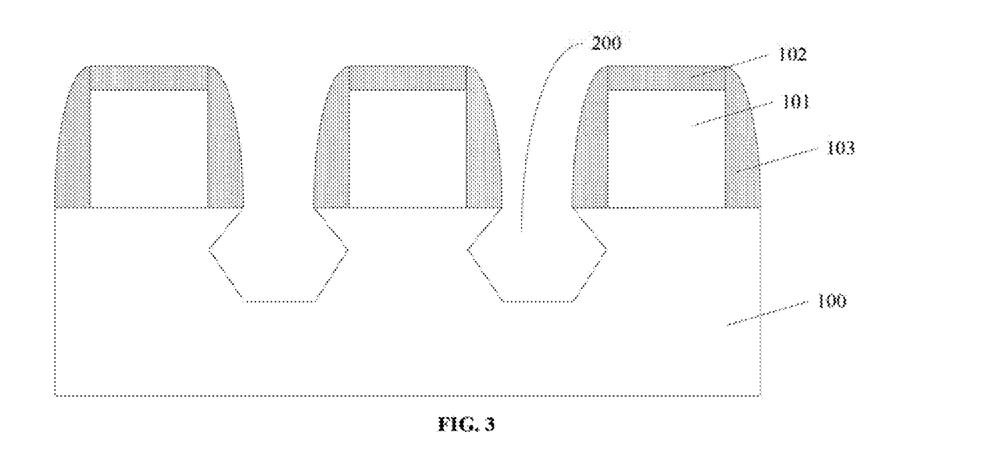

Returning to FIG. 8, after the gate structures are formed on the semiconductor substrate, trenches are formed on both sides of a gate structure in the semiconductor substrate (S103). FIG. 3 illustrates a corresponding semiconductor structure.

As shown in FIG. 3, trenches 200 may be formed on both sides of each gate structure 101 in the semiconductor substrate 100.

In one embodiment, before the trenches 200 are formed, a sidewall spacer 103 may be formed on the sidewall of each gate structure 101. The sidewall spacer 103 may be made of $SiO_2$, $Si_3N_4$, or a stacked structure with $SiO_2$ and $Si_3N_4$. The sidewall spacers 103 can provide protection for the gate structures 101 in subsequent fabrication steps.

After the sidewall spacers 103 are formed, sidewall spacers 103 and the gate structures 101 may be used as an etch mask to etch portions of the semiconductor substrate 100 on both sides of each gate structure 101 to form trenches 200. A strained material may be used to fill up the trenches, and source and drain regions may be formed subsequently.

In one embodiment, the transistors to be formed may be planar transistors. A sidewall of each trench 200 can have a "Σ" shape with respect to the surface of the semiconductor substrate 100. The Σ shaped sidewalls may increase the contact area between the subsequently-formed stress layer in a trench 200 and the channel regions of the adjacent transistors. The stress applied on the channel region may be increased.

In one embodiment, a dry etch process and a wet etch process may be used to form the "Σ"-shaped sidewalls of the trenches 200. Specifically, the dry etch process may be first used to etch the semiconductor substrate 100 to form openings. An opening formed by the dry etch process may have vertical sidewalls respect to the surface of the semiconductor substrate 100. The wet etch process may be further used to etch the semiconductor substrate 100 along the openings. Because the etch rate of the wet etch process may vary in different crystal orientations of the semiconductor substrate 100, trenches 200 each with "Σ"-shaped sidewalls may be formed. The etchant gases of the dry etch process can include one or more of a $Cl_2$ gas, a $CCl_2F_2$ gas, a HBr gas, and HCl gas. The etching solution of the wet etch process may be a KOH (potassium hydroxide) solution and/or a TMAH (tetramethylammonium) hydroxide solution.

In certain embodiments of the present disclosure, the transistors to be formed may be FinFETs. The trenches 200 formed by etching the fin structure on both sides of each gate structure 101 may include sidewalls perpendicular to the surface of the semiconductor substrate 100. Because in FinFETs, the width of a channel region is often sufficiently large, stress layer formed in the trenches 200 with vertical sidewalls may apply sufficient stress on the channel regions of adjacent FinFETs. Thus, only trenches 200 with vertical sidewalls need to be formed for FinFETs. In various embodiments, the vertical sidewalls may be formed by a dry etch process.

Figure 4:
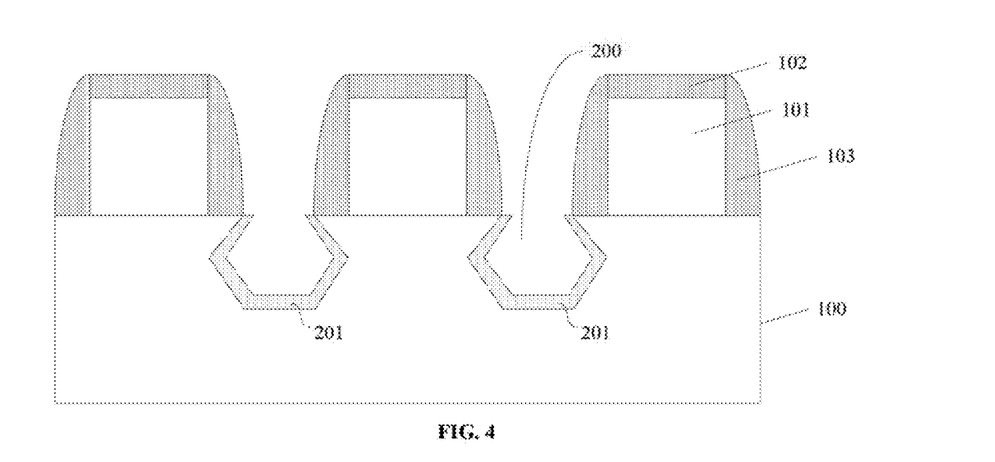

Returning to FIG. 8, after trenches are formed on both sides of each gate structure in the semiconductor substrate, a seed layer is formed on the inner sidewalls of each trench (S104). FIG. 4 illustrates a corresponding semiconductor structure.

As shown in FIG. 4, a seed layer 201 may be formed on the inner sidewalls of each trench 200. In one embodiment, the transistors to be formed may be PMOS transistors. The seed layer may be made of SiGe. The seed layer 201 may apply compressive stress on the channel regions of adjacent PMOS transistors to improve the hole mobility in the channel regions of the PMOS transistors.

The seed layer 201 may be formed by using a selective epitaxial deposition process. The reactant gases of the selective epitaxial deposition process may include a germanium-source gas, a silicon-source gas, an HCl gas, and/or an $H_2$ gas. The germanium-source gas may be $GeH_4$, the silicon-source gas may include $SiH_4$, $SiH_2Cl_2$, and/or other suitable silicon-source gases. The flow rate of the germanium-source gas, the silicon-source gas, and the HCl gas may each be about 1 sccm to about 1000 sccm. The flow rate of the $H_2$ may be about 0.1 slm to about 50 slm.

The deposition temperature of the selective epitaxial deposition process may be about 500 degrees Celsius to about 800 degrees Celsius. The deposition pressure may be about 1 Torr to about 100 Torr. The HCl gas may be a selective gas for enhancing deposition selectivity such that the seed layer 201 can only be formed on the inner sidewalls of each trench 200. By adjusting the ratio of the flow rate of germanium-source gas to the flow rate of silicon-source gas in the selective epitaxial deposition process, the Ge content in the seed layer 201 may be adjusted. The Ge content may be the mole fraction of Ge in the seed layer.

In one embodiment, the Ge content in the seed layer 201 may be about 5% to about 25%. The Ge content in the seed layer 201 may be sufficiently low such that the lattice mismatch between the seed layer 201 and the semiconductor substrate 100 may be desirably small such that the crystal lattice of the seed layer 201 may be strained to match the crystal lattice of the semiconductor substrate 100. Little defects formed at the interface between the semiconductor substrate 100 and the seed layer 201. As the thickness of the seed layer 201 increases, defects in the seed layer 201 can gradually diminish or even disappear. In one embodiment, the thickness of the seed layer 201 may be about 20 nm to about 30 nm for eliminating defects on the surface of the seed layer 201. Quality of the body layer formed subsequently on the seed layer 201 may be improved accordingly.

The Ge content in the seed layer 201 may be uniformly distributed. In other various embodiments of the present disclosure, the Ge content in the seed layer 201 can increase with the thickness of the seed layer 201. For example, the Ge content in the seed layer can gradually increase from the interface between the seed layer 201 and the trench 200 to the surface of the surface of the seed layer 201. By gradually increasing the Ge content, lattice mismatch between the seed layer 201 and the inner sidewalls of the trench 200 may be reduced, and defects in the seed layer 201 may be further reduced.

In other various embodiments of the present disclosure, the transistors to be formed may be NMOS transistors. The seed layer 201 may be made of SiC for applying tensile stress on the channel regions of the adjacent NMOS transistors to improve the electron mobility in the channel regions of the NMOS transistors.

The seed layer 201 may be formed by using a selective epitaxial deposition process. The reactant gases of the selective epitaxial deposition process may include a carbon-source gas, a silicon-source gas, an HCl gas, and/or an $H_2$ gas. The carbon-source gas may be $CH_4$, the silicon-source gas may include $SiH_4$, $SiH_2Cl_2$, and/or other suitable silicon-source gases. The flow rate of the carbon-source gas, the silicon-source gas, and the HCl gas may each be about 1 sccm to about 1000 sccm. The flow rate of $H_2$ may be about 0.1 slm to about 50 slm. The deposition temperature of the selective epitaxial deposition process may be about 500 degrees Celsius to about 800 degrees Celsius. The deposition pressure may be about 1 Torr to about 100 Torr.

By adjusting the ratio of the flow rate of carbon-source gas to the flow rate of silicon-source gas, the C content in the seed layer 201 may be adjusted. The C content may be the mole fraction of carbon. The seed layer 201 can have a C content of about 1% to about 3%. The C content of the seed layer 201 may be sufficiently low such that the lattice mismatch between the seed layer 201 and the semiconductor substrate 100 may be desirably small. Little defects may be formed at the interface between the seed layer 201 and the semiconductor substrate 100. As the thickness of the seed layer 201 increases, defects in the seed layer 201 can gradually diminish or even disappear.

The C content in the seed layer 201 may be uniformly distributed. The C content of the seed layer 201 may also increase with the thickness of the seed layer 201 to further reduce the lattice mismatch between the seed layer 201 and the inner sidewalls of the trenches 200. The defects in the seed layer 201 may be further reduced.

Figure 5:
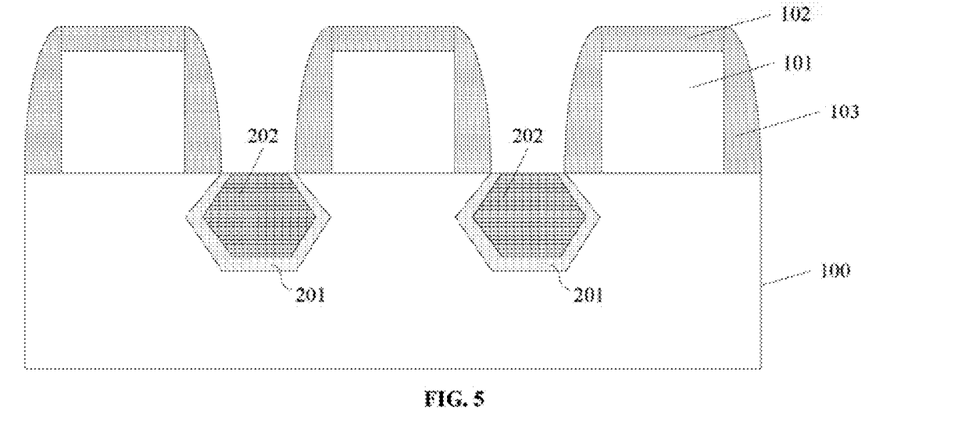

Returning to FIG. 8, after the seed layer is formed on the inner sidewalls of each trench, a body layer is formed on the seed layer to fill up the trenches (S105). FIG. 5 illustrates a corresponding semiconductor structure.

As shown in FIG. 5, a body layer 202 may be formed on the seed layer 201 to fill up the trenches 200. The body layer 202 and the seed layer 201 may form the stress layer in the trenches 202 to apply stress on the channel regions of the transistors. The properties and performance of the transistors may be improved.

In one embodiment, the body layer 202 may also be made of SiGe for applying compressive stress on the channel regions of the PMOS transistors. The properties and performance of the PMOS transistors can then be improved. In other various embodiments of the present disclosure, the body layer 202 can also be made of SiC.

The body layer 202 may be formed by using a selective epitaxial deposition process. The reactant gases of the selective epitaxial deposition process may include a germanium-source gas, a silicon-source gas, an HCl gas, and/or an $H_2$ gas. The germanium-source gas may be $GeH_4$, the silicon-source gas may include $SiH_4$, $SiH_2Cl_2$, and/or other suitable silicon-source gases. The flow rate of the germanium-source gas, the silicon-source gas, and the HCl gas may each be about 1 sccm to about 1000 sccm. The flow rate of the $H_2$ may be about 0.1 slm to about 50 slm. The deposition temperature of the selective epitaxial deposition process may be about 500 degrees Celsius to about 800 degrees Celsius. The deposition pressure of the selective epitaxial deposition process may be about 1 Torr to about 1000 Torr. The HCl gas may be a selective gas for enhancing deposition selectivity such that the body layer 202 can only be formed on the seed layer 201. By adjusting the ratio of the flow rate of germanium-source gas to the flow rate of silicon-source gas in the selective epitaxial deposition process, the Ge content in the body layer 202 may be adjusted. The Ge content may be the mole fraction of Ge in the body layer 202.

The Ge content in the body layer 202 may be higher than the Ge content in the seed layer 201 to increase the lattice mismatch between the body layer 202 and the semiconductor substrate 100. Thus, the body layer 202 can apply a higher stress on the channel regions of the adjacent transistors. In one embodiment, the Ge content in the body layer 202 may be about 25% to about 45%.

The lattice mismatch between the seed layer 201 and the body layer 202 may be sufficiently small. Compared to forming the body layer 202 directly on the inner sidewalls of the trenches 200, forming the body layer 202 on the seed layer 201 can reduce the defects formed in the body layer 202.

The Ge content in the body layer 202 may be uniformly distributed. In other various embodiments of the present disclosure, the Ge content in the body layer 202 can also gradually increase with an increasing body layer thickness to further reduce the lattice mismatch at the interface between the seed layer 201 and the body layer 202. The defects formed in the body layer 202 may be further reduced.

In other various embodiments of the present disclosure, the Ge content in the body region 202 can gradually decrease near the top surface of the body region 202 to reduce the lattice mismatch between the body layer 202 and the subsequently-formed interlayer on the body layer 202. Quality of the subsequently-formed interlayer may be improved.

In one embodiment, the body layer 202 may be doped with P-type dopants. The P-type dopants may be B, Ge, and/or In. The P-type dopants may be used to provide carriers for the PMOS transistors.

When forming the body layer 202 with the selective epitaxial deposition process, an in-situ doping process may be used to dope P-type dopants into the body layer 202. In one embodiment, the reactant gases of the selective epitaxial deposition process for forming the body layer 202 may also include a doping gas. The doping gas may be a P-type dopant-containing gas including $B_2H_6$. The flow rate of the doping gas may be about 1 sccm to about 1000 sccm.

In other various embodiments of the present disclosure, the body layer 202 can also be made of SiC. A selective epitaxial deposition process may be used to form the body layer 202. The C content in the body layer 202 may be about 3% to about 10% to increase the lattice mismatch between the body layer 202 and the semiconductor substrate 100. Thus, the body layer 202 can apply a higher tensile stress on the channel regions of the adjacent transistors. Properties and performance of the NMOS transistors may be improved accordingly.

The C content in the body layer 202 may be uniformly distributed. In other various embodiments of the present disclosure, the C content of the body layer 202 can gradually increase with the thickness of the body layer 202 to further reduce the lattice mismatch at the interface between the body layer 202 and the seed layer 201. Thus, the defects in the body layer 202 may be reduced. In other various embodiments of the present disclosure, the C content in the body layer 202 may gradually decrease near the top surface of the body layer 202 to reduce the lattice mismatch between the body layer 202 and the subsequently-formed interlayer. The quality of the subsequently-formed interlayer may be improved. The body layer 202 may be doped with N-type dopants. The N-type dopants may be P, As, and/or Sb. The N-type dopants can be used to provide carriers for the PMOS transistors. When the body layer 202 is being formed using the selective epitaxial deposition process, an N-type doping gas may be introduced into the reaction chamber with the reactant gases. For example, the N-type doping gas may be an N-type dopant-containing gas including $PH_3$. A body layer 202 doped with N-type dopants may be formed. The flow rate of the $PH_3$ may be about 1 sccm to about 1000 sccm.

Returning to FIG. 8, after the body layer is formed on the seed layer to fill up the trenches, an interlayer is formed on the seed layer and the body layer (S106). FIG. 6 illustrates a corresponding semiconductor structure.

As shown in FIG. 6, an interlayer 203 may be formed on the seed layer 201 and the body layer 202.

In one embodiment, the interlayer 203 may be made of un-doped or intrinsic silicon. A selective epitaxial deposition process may be used to form the interlayer 203. The reactant gases of the selective epitaxial deposition process can include a silicon-source gas, a HCl gas, and/or a $H_2$ gas. The silicon-source gas may include $SiH_4$, $SiH_2Cl_2$, or other suitable silicon-source gases. The flow rate of the silicon-source gas or the HCl gas may each be about 1 sccm to about 1000 sccm. The flow rate of $H_2$ may be about 0.1 slm to about 50 slm. The deposition temperature of the selective epitaxial deposition process may be about 500 degrees Celsius to about 800 degrees Celsius. The deposition pressure may be about 1 Torr to about 100 Torr. The HCl gas may be a selective gas for enhancing the deposition selectivity such that the interlayer 203 can only be formed on the body layer 202.

Since the interlayer 203 may be made of un-doped silicon, no doping gas needs to be introduced into the selective epitaxial deposition process for forming the interlayer 203. Thus, compared to the formations of SiGe or SiC, the deposition of the interlayer 203 may be slower. Although the lattice constant of the interlayer 203 may be different from the lattice constant of the body layer 202 and the lattice constant of the seed layer 201, the slow interlayer deposition and strain between crystal lattice may enable a smooth lattice constant transition between the interlayer 203 and the body layer 202, and between the interlayer 203 and the seed layer 201. Thus, little or no defects may be formed at the interface between the interlayer 203 and the body layer 202, and the interface between the interlayer 203 and the seed layer 201. Further, as the thickness of the interlayer 203 increases, defects at the interface can gradually diminish or even disappear such that almost no defects may be formed on the surface of the interlayer 203. Quality of the subsequently-formed capping layer on the interlayer may be improved. In addition, because the lattice mismatch between the interlayer 203 and the subsequently-formed capping layer may be less than the lattice mismatch between the capping layer and the body layer 202/seed layer 201, the interlayer 203 may function as a lattice constant transition layer. Compared to a capping layer formed directly on the seed layer 201 and the body layer 202, the capping layer formed on the interlayer 203 may enable decreased lattice mismatch between the capping layer and the materials stacked under the capping layer. The deposition of the capping layer can have improved quality.

In one embodiment, the thickness of the interlayer 203 may be about 1 Å to about 50 Å. The thickness of the interlayer 203 may be sufficiently small such that adverse effects on the carrier mobility of the transistors may be prevented. In addition, when the capping layer is formed in a subsequent fabrication step, the dopants in the capping layer and the body layer 202 can easily diffuse into the interlayer 203 to reduce the resistance of the interlayer 203.

Returning to FIG. 8, after the interlayer is formed on the seed layer and the body layer, a capping layer is formed on the interlayer to have a top surface higher than the surface of the semiconductor substrate (S107). FIG. 7 illustrates a corresponding semiconductor structure.

As shown in FIG. 7, a capping layer 204 may be formed on the interlayer 203. The top surface of the capping layer 204 may be higher than the surface of the semiconductor substrate 100. The growth rate of the capping layer 204 may be higher than the growth rate of the interlayer 203.

The capping layer 204 can also be made of a strained material to apply stress on the channel regions of the adjacent transistors. Also, the top surface of the capping layer 204 may be higher than the surface of the semiconductor substrate 100 such that the subsequently-formed metal-semiconductor compound layer, to be formed on the source and drain regions, can have a top surface higher than the surface of the semiconductor substrate 100.

In one embodiment, the capping layer 204 may be made of SiGe. A selective epitaxial deposition process may be used to form the capping layer 204. The reactant gases of the selective epitaxial deposition process may include a germanium-source gas, a silicon-source gas, an HCl gas, and/or an $H_2$ gas. The germanium-source gas may be $GeH_4$, the silicon-source gas may include $SiH_4$, $SiH_2Cl_2$, and/or other suitable silicon-source gases. The flow rate of the germanium-source gas, the silicon-source gas, and the HCl gas may each be about 1 sccm to about 1000 sccm. The flow rate of the $H_2$ may be about 0.1 slm to about 50 slm. The HCl gas may be a selective gas for enhancing deposition selectivity such that the capping layer 204 can only be formed on the interlayer 203. By adjusting the ratio of the flow rate of germanium-source gas to the flow rate of silicon-source gas in the selective epitaxial deposition process, the Ge content in the capping layer 204 may be adjusted. The Ge content may be the mole fraction of Ge in the capping layer 204.

In one embodiment, the Ge content in the capping layer may lower than the Ge content in the body layer 202. If the capping layer 204 is formed directly on the seed layer 201 and the body layer 202, an undesirably large difference between the Ge content in the capping layer 204 and the Ge content in the body layer 202 may be formed. Also, when the capping layer 204 is being formed using the selective epitaxial deposition process, a plurality of gases may be involved in the deposition process, and the capping layer 204 can have a considerably high growth rate. As a result, a significant number of dislocation defects may be formed at the interface between the capping layer 204 and the seed layer 201, and at the interface between the capping layer 204 and the body layer 202. The capping layer 204 formed from the deposition may have poor quality. An undesirably large amount of defects may be formed in the capping layer 204. The properties and performance of the transistors may be adversely affected.

In one embodiment, the Ge content in the capping layer 204 may be about 1% to about 15%. Because of the sufficiently low Ge content in the capping layer 204, the lattice mismatch between the capping layer 204 and the lattice constant of the interlayer 203 may be small. Also, because the crystal lattice of the capping layer 204 may be strained to match the crystal lattice of the interlayer 203, little or no defects may be formed at the interface between the capping layer 204 and the interlayer 203. As the thickness of the capping layer 204 increases, defects formed in the capping layer 204 may gradually diminish or even disappear. Thus, the capping layer 204 formed by the deposition may have improved quality. The thickness of the capping layer 204 may be about 10 nm to about 20 nm.

The Ge content in the capping layer 204 may be uniformly distributed. In other various embodiments of the present disclosure, the Ge content in the capping layer 204 may increase with the thickness of the capping layer 204. For example, the Ge content in the capping layer 204 may increase from the interface between the capping layer 204 and the interlayer 203 to the top surface of the capping layer 204, so as to further reduce the lattice mismatch between the capping layer 204 and the interlayer 203 at the interface. The defects in the capping layer 204 may be reduced.

In one embodiment, the capping layer 204 may be doped with P-type dopants. The P-type dopants may be B, Ge, and/or In. The P-type dopants may reduce the resistance of the capping layer 204 so that the resistance of the source region and the drain region of a transistor may be reduced. The P-type dopants may also provide carriers to the source region and the drain region of the transistor.

When the capping layer 204 is formed using the selective epitaxial deposition process, an in-situ doping process may be used to dope the P-type dopants into the capping layer 204. In one embodiment, the reactant gases of the selective epitaxial deposition process to form the capping layer 204 may include a doping gas. The doping gas may be a P-type dopant-containing gas including $B_2H_6$. The flow rate of the doping gas may be about 1 sccm to about 1000 sccm.

In other various embodiments of the present disclosure, the capping layer 204 can also be made of SiC. A selective epitaxial deposition process may be used to form the capping layer 204. The reactant gases of the selective epitaxial deposition process may include a carbon-source gas, a silicon-source gas, an HCl gas, and/or an $H_2$ gas. The carbon-source gas may be $CH_4$, and the silicon-source gas may include $SiH_4$ gas, $SiH_2Cl_2$ gas, and/or other suitable silicon-source gases. The flow rate of the carbon-source gas, the silicon-source gas, and the HCl gas may each be about 1 sccm to about 1000 sccm. The flow rate of the $H_2$ may be about 0.1 slm to about 50 slm. The deposition temperature of the selective epitaxial deposition process may be about 500 degrees Celsius to about 800 degrees Celsius. The deposition pressure of the selective epitaxial deposition process may be about 1 Torr to about 100 Torr. By adjusting the ratio of the flow rate of carbon-source gas and the flow rate of silicon-source gas in the selective epitaxial deposition process, the C content in the capping layer 204 may be adjusted. The C content may be the mole fraction of carbon in the capping layer 204.

The C content in the capping layer 204 may be lower than the C content in the body layer 202. The C content in the capping layer 204 may be about 0.5% to about 2%. Because the C content in the capping layer 204 may be sufficiently low, the lattice mismatch between the capping layer 204 and the interlayer 203 may be sufficiently small to improve the capping layer 204 formed by the deposition process. The C content may be uniformly distributed in the capping layer 204, or the C content may increase with the thickness of the capping layer.

The capping layer 204 may be doped with N-type dopants. The N-type dopants may be P, As, and/or Sb. The N-type dopants can reduce the resistance of the capping layer 204 so as to reduce the resistance of the source region and the drain region of a transistor. The N-type dopants can also provide carriers for the source region and drain region of the transistor. When the selective epitaxial deposition process is used for forming the capping layer 204, a doping gas may be introduced to the reaction with the reactant gases. The doping gas may include an N-type dopant-containing gas including $PH_3$ gas. The flow rate of the doping gas may be about 1 sccm to about 1000 sccm.

When the capping layer 204 is being formed, the selective epitaxial deposition process may have a sufficiently high deposition temperature. Dopants in the capping layer 204 may diffuse into the interlayer 203 such that the interlayer 203 may also contain the dopants. The resistance of the interlayer 203 can thus be reduced. Meanwhile, during the high-temperature deposition process, dopants in the body layer 202 may also diffuse upward into the to interlayer 203. Thus, dopant distribution in the interlayer 203 may be desirably uniform.

In summary, in various embodiments of the present disclosure, an interlayer may be formed on the stress layer before the capping layer is formed. The deposition rate of the interlayer may be lower than the deposition rate of the capping layer. Although lattice mismatch may exist between the interlayer and the stress layer, because of the sufficiently low deposition rate and the strained lattice, little or no defects may be formed at the interface between the interlayer and the stress layer. Also, as the thickness of the interlayer increases, defects formed in the interlayer can gradually diminish or even disappear such that almost no defects may be formed on the surface of the interlayer. The capping layer formed subsequently on the interlayer can thus have improved quality. Also, since the lattice mismatch between the interlayer and the subsequently-formed capping layer may be smaller than the lattice mismatch between the capping layer and the stress layer, the interlayer can function as a lattice constant transition layer between the capping layer and the stress layer. Compared to a capping layer formed directly on the stress layer, forming the capping layer on the interlayer may enable a decreased lattice mismatch between the capping layer and the materials stacked under the capping layer. The capping layer by the deposition process can have an improved quality, and the properties and performance of the transistor may be improved.

Another aspect of the present disclosure further provides a transistor fabricated by using the method described above.

As shown in FIG. 7, the transistor may include a semiconductor substrate 100 and a gate structure 101 on the semiconductor substrate 100. The transistor may also include trenches formed in the semiconductor substrate 100 on both sides of the gate structure 101, and a stress layer formed in the trenches to fill up the trenches. The transistor may further include an to interlayer 203 formed on the stress layer and a capping layer 204 formed on the interlayer 203. The top surface of the capping layer 204 may be higher than the surface of the semiconductor substrate 100. The lattice mismatch between the capping layer 204 and the interlayer 203 may be smaller than the lattice mismatch between the capping layer 204 and the stress layer.

In one embodiment, the stress layer may include a seed layer 201 covering the inner sidewalls of the trenches and a body layer 202 on the seed layer 201. The seed layer 201 may be made of SiGe, the body layer 202 may be made of SiGe, and the capping layer may be made of SiGe. The Ge content in the seed layer 201, the body layer 202, and the capping layer 204 may vary from each other. For example, the Ge content in the seed layer 201 may be lower than the Ge content in the body layer 202, and the Ge content in the capping layer 204 may be lower than the Ge content in the body layer 202. In one embodiment, the Ge content in the seed layer 201 may be about 5% to about 25%, the Ge content in the body layer 202 may be about 25% to about 45%, and the Ge content in the capping layer 204 may be about 1% to about 15%. The body layer 202 and the capping layer 204 may be doped with P-type dopants. The P-type dopants may be B, Ga, and/or In.

In other various embodiments of the present disclosure, the seed layer 201 may be made of SiC, the body layer 202 may be made of SiC, and the capping layer 204 may be made of SiC. The C content in the seed layer 201, the body layer 202, and the capping layer 204 may vary from each other. For example, the C content in the seed layer 201 may be lower than the C content in the body layer 202, and the C content of the capping layer 204 may be lower than the C content of the body layer 202. In one embodiment, the C content in the seed layer 201 may be about 1% to about 3%, the C content in the body layer 202 may be about 3% to about 10%, and the C content of the capping layer 204 may be about 0.5% to about 2%. The body layer 202 and the capping layer 204 may be doped with N-type dopants, and the N-type dopants may be P, As, and/or Sb.

The interlayer 203 may be made of Si. The thickness of the interlayer 203 may be about 1 Å to about 50 Å. An inner sidewall of a trench may be vertical with respect to the surface of the semiconductor substrate 100. Alternatively, an inner sidewall of the trench may have a "Σ" shape with respect to the surface of the semiconductor substrate 100. The thickness of the seed layer may be about 20 nm to about 30 nm. The thickness of the capping layer may be about 10 nm to about 20 nm.

In one embodiment, a sidewall spacer 103 may be formed on the sidewall of a gate structure 101. A patterned mask layer 102 may be formed on the top surface of the gate structure 101. The sidewall spacer 103 and the patterned mask layer 102 may be configured to protect the gate structure 101 in subsequent fabrication steps.

In one embodiment, an interlayer 203 may be formed between the capping layer 204 and the stress layer 202 of the transistor. The lattice mismatch between the interlayer 203 and the capping layer 204 may be smaller than the lattice mismatch between the capping layer 204 and the stress layer 202. Thus, the interlayer 203 may function as a lattice constant transition layer. Compared to forming a capping layer 204 directly on the stress layer 202, forming the capping layer 204 on the interlayer 203 may enable decreased lattice mismatch between the capping layer 204 and the materials stacked under the capping layer 204. The capping layer formed by the deposition may have improved quality, and the properties and performance of the transistor may be improved.

Thus, in the present disclosure, after the gate structures are formed on the semiconductor substrate, trenches are form in the semiconductor substrate on both sides of each gate structure. A stress layer is formed in the trenches and an interlayer is formed on the stress layer. Further, the capping layer is formed on the interlayer. The deposition rate for forming the interlayer is lower than the deposition rate for forming the capping layer. Although lattice mismatch exists between the interlayer and the stress layer, because of the desirably low deposition rate and strained crystal lattice, the lattice constant at the interface between the interlayer and the stress layer may have a transition such that little or no defects may be formed at the interface between the interlayer and the stress layer.

Also, as the thickness of the interlayer increases, defects in the interlayer can diminish or even disappear, and almost no defects are formed on the surface of the interlayer. The capping layer formed subsequently on the interlayer can have improved quality. In addition, the lattice mismatch between the interlayer and the subsequently-formed capping layer is lower than the lattice mismatch between the capping layer and the stress layer, the interlayer can thus function as a lattice constant transition layer. Compared to forming the capping layer directly on the stress layer, forming the capping layer the interlayer may enable lower lattice mismatch between the capping layer and the materials stacked under the capping layer. The capping layer formed by the deposition process can have improved quality. The properties and performance of the transistors may be improved.

Further, the thickness of the interlayer is about 1 Å to about 50 Å, sufficiently low to prevent adverse effects to the carrier mobility of the transistors. Also, when the capping layer is being formed, under the high temperature of the epitaxial deposition process, dopants in the capping layer and the stress layer may easily diffuse into the interlayer. Since the thickness of the interlayer is sufficiently small, the interlayer may be fully doped such that the resistance of the interlayer can be reduced.

The transistor provided in the present disclosure includes an interlayer between the capping layer and the stress layer in the semiconductor substrate on both sides of the gate structure of the transistor. The lattice mismatch between the interlayer and the capping layer is lower than the lattice mismatch between the capping layer and the stress layer. Thus, the interlayer can function as a lattice constant transition layer. Compared to forming the capping layer directly on the stress layer, forming the capping layer the interlayer may enable lower lattice mismatch between the capping layer and the materials stacked under the capping layer. The capping layer formed by the deposition process can have improved quality. The capping layer formed by the deposition process can have improved quality, and the properties and performance of the transistor may be improved accordingly.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a semiconductor device, comprising:
    providing a semiconductor substrate;
    forming a gate structure on the semiconductor substrate;
    forming trenches in the semiconductor substrate on both sides of the gate structure;
    forming a seed layer on inner sidewalls of each trench and a body layer on the seed layer to fill up the trench;
    forming an interlayer on the seed layer and the body layer, and
    forming a capping layer on the interlayer, wherein a top surface of the capping layer is higher than a top surface of the semiconductor substrate, a top surface of the body layer levels with the top surface of the semiconductor substrate, and a lattice mismatch between the interlayer and the capping layer is lower than a lattice mismatch between the capping layer and the body layer.

2. The method according to claim 1, wherein the interlayer is made of Si with a thickness of about 1 Å to about 50 Å.

3. The method according to claim 1, wherein parameters of a selective epitaxial deposition process for forming the interlayer include a silicon-source gas, an HCl gas, and a $H_2$ gas, wherein
    the silicon-source gas includes a $SiH_4$ gas, a $SiH_2Cl_2$ gas, or a combination of a $SiH_4$ and a $SiH_2Cl_2$ gas;
    a flow rate of each of the silicon-source gas and the HCl gas is about 1 sccm to about 1000 sccm, and a flow rate of the $H_2$ is about 0.1 slm to about 50 slm;
    a deposition temperature of the selective epitaxial deposition process is about 500 degrees Celsius to about 800 degrees Celsius; and
    a deposition pressure is about 1 Torr to about 100 Torr.

4. The method according to claim 1, wherein the inner sidewall of the trench is vertical with respect to the surface of the semiconductor substrate or has a "Σ" shape with respect to the surface of the semiconductor substrate.

5. The method according to claim 1, wherein the seed layer is made of SiGe, and a Ge content in the seed layer gradually increases from an interface between the seed layer and the trench to an interface between the seed layer and the body layer.

6. The method according to claim 1, wherein the body layer is made of SiGe, and a Ge content in the body layer gradually decreases from an interface between the seed layer and the body layer to an interface between the body layer and the interlayer.

7. A method for forming a semiconductor device, comprising:
    providing a semiconductor substrate;
    forming a gate structure on the semiconductor substrate;
    forming trenches in the semiconductor substrate on both sides of the gate structure;
    forming a stress layer on inner sidewalls of each trench to fill up the trench;
    forming an interlayer on the stress layer, and
    forming a capping layer on the interlayer, wherein a top surface of the capping layer is higher than a top surface of the semiconductor substrate, a lattice mismatch between the interlayer and the capping layer is lower than a lattice mismatch between the capping layer and the stress layer, and a growth rate of the capping layer is higher than a growth rate of the interlayer.

8. The method according to claim 7, wherein the stress layer includes a seed layer formed on the inner sidewall of each trench and a body layer formed on the seed layer.

9. The method according to claim 8, wherein:
    the seed layer is made of SiGe, the body layer is made of SiGe, the capping layer is made of SiGe; a Ge content in the seed layer, a Ge content in the body layer, and a Ge content in the capping layer being different from one another;
    the Ge content in the seed layer is lower than the Ge content in the body layer, and
    the Ge content in the capping layer is lower than the Ge content in the body layer.

10. The method according to claim 9, wherein:
    the Ge content in the seed layer is about 5% to about 25%;
    the Ge content in the body layer is about 25% to 45%; and
    the Ge content in the capping layer is about 1% to about 15%.

11. The method according to claim 8, wherein
the seed layer is made of SiC, the body layer is made of SiC, and the capping layer is made of SiC; a C content in the seed layer, a C content in the body layer, and a C content in the capping layer being different from one another;
the C content in the seed layer is lower than the C content in the body layer, and
the C content in the capping layer is lower than the C content in the body layer.

12. The method according to claim 11, wherein:
the C content in the seed layer is about 1% to 3%;
the C content in the body layer is about 3% to about 10%; and
the C content in the capping layer is about 0.5% to about 2%.

13. The method according to claim 8, wherein parameters of a selective epitaxial deposition process to form the seed layer, the body layer, and the capping layer include a germanium-source gas, a silicon-source gas, a HCl gas, and a $H_2$ gas, wherein:
the germanium-source gas is a $GeH_4$ gas, the silicon-source gas includes a $SiH_4$ gas, a $SiH_2Cl_2$ gas, or a combination of a $SiH_4$ gas and a $SiH_2Cl_2$ gas;
a flow rate of each of the germanium-source gas, the silicon-source gas, and the HCl gas is about 1 sccm to about 1000 sccm, and a flow rate of the $H_2$ is about 0.1 slm to about 50 slm;
a deposition temperature of the selective epitaxial deposition process is about 500 degrees Celsius to about 800 degrees Celsius; and
a deposition pressure is about 1 Torr to about 100 Torr.

14. The method according to claim 13, wherein the selective epitaxial deposition process for forming the body layer and the capping layer further includes a $B_2H_6$-containing doping gas with a flow rate of about 1 sccm to about 1000 sccm.

15. The method according to claim 8, wherein parameters of a selective epitaxial deposition process to form the seed layer, the body layer, and the capping layer include a carbon-source gas, a silicon-source gas, a HCl gas, and a $H_2$ gas, wherein:
the carbon-source gas is a $CH_4$ gas, and the silicon-source gas includes a $SiH_4$ gas, a $SiH_2Cl_2$ gas, or a combination of a $SiH_4$ gas and a $SiH_2Cl_2$ gas;
a flow rate of each of the carbon-source gas, the silicon-source gas, and the HCl gas is about 1 sccm to about 1000 sccm, and a flow rate of the $H_2$ is about 0.1 slm to about 50 slm;
a deposition temperature of the selective epitaxial deposition process is about 500 degrees Celsius to about 800 degrees Celsius; and
a deposition pressure is about 1 Torr to about 100 Torr.

16. The method according to claim 15, wherein the selective epitaxial deposition process for forming the body layer and the capping layer further includes a $PH_3$-containing doping gas with a flow rate of about 1 sccm to about 1000 sccm.

17. A semiconductor device, comprising:
a semiconductor substrate;
a gate structure on the semiconductor substrate;
trenches in the semiconductor substrate on both sides of the gate structure;
a stress layer on inner sidewalls of each trench to fill up the trench;
an interlayer on the stress layer; and
a capping layer on the interlayer, wherein a top surface of the capping layer is higher than a top surface of the semiconductor substrate, a lattice mismatch between the capping layer and the interlayer is lower than a lattice mismatch between the capping layer and the stress layer, and a growth rate of the capping layer is higher than a growth rate of the interlayer.

18. The semiconductor device according to claim 17, wherein the stress layer includes a seed layer on the inner sidewalls of each trench and a body layer on the seed layer.

19. The semiconductor according to claim 18, wherein the seed layer is made of SiGe with a Ge content of about 5% to about 25%; the body layer is made of SiGe with a Ge content of about 25% to about 45%; and the capping layer is made of SiGe with a Ge content of about 1% to 15%.

20. The semiconductor according to claim 18, wherein the seed layer is made of SiC with a C content of about 1% to about 3%; the body layer is made of SiC with a C content of about 3% to about 10%; and the capping layer is made of SiC with a C content of about 0.5% to 2%.

* * * * *